United States Patent [19]

Takahashi et al.

[11] Patent Number: 4,544,627

[45] Date of Patent: * Oct. 1, 1985

[54] NEGATIVE IMAGE FORMING PROCESS IN O-QUINONE DIAZIDE LAYER UTILIZING LASER BEAM

[75] Inventors: Yonosuke Takahashi; Hiromichi Tachikawa; Fumiaki Shinozaki; Tomoaki Ikeda, all of Saitama, Japan

[73] Assignee: Fuji Photo Film Co., Ltd., Japan

[*] Notice: The portion of the term of this patent subsequent to Oct. 26, 1999 has been disclaimed.

[21] Appl. No.: 548,132

[22] Filed: Nov. 3, 1983

Related U.S. Application Data

[63] Continuation of Ser. No. 300,822, Sep. 10, 1981, abandoned, which is a continuation-in-part of Ser. No. 089,846, Oct. 31, 1979, abandoned.

[30] Foreign Application Priority Data

Oct. 31, 1978 [JP] Japan ................................. 53-134270

[51] Int. Cl.$^4$ ............................................. G03F 7/26
[52] U.S. Cl. .................................. 430/325; 430/141; 430/154; 430/165; 430/166; 430/189; 430/190; 430/191; 430/193; 430/327; 430/328; 430/330; 430/945
[58] Field of Search ............... 430/325, 945, 328, 330, 430/165, 189, 154, 166, 141, 190, 191, 193, 327, 1, 2

[56] References Cited

U.S. PATENT DOCUMENTS

| | | | |
|---|---|---|---|
| 3,567,453 | 3/1971 | Borden | 430/191 |
| 3,759,711 | 9/1973 | Rauner et al. | 430/191 |
| 3,778,274 | 12/1973 | Inoue et al. | 430/191 |
| 3,900,325 | 8/1975 | Christensen et al. | 430/191 |
| 3,929,488 | 12/1975 | Smith | 430/191 |
| 4,028,111 | 6/1977 | Iwasaki et al. | 430/191 |
| 4,063,949 | 12/1977 | Uhlig et al. | 430/945 |
| 4,105,450 | 8/1978 | Shinozaki et al. | 430/193 |
| 4,196,003 | 4/1980 | Watanabe | 430/193 |
| 4,356,254 | 10/1982 | Takahashi et al. | 430/296 |

FOREIGN PATENT DOCUMENTS

2547905 4/1977 Fed. Rep. of Germany ...... 430/191

OTHER PUBLICATIONS

Dinaburg, M. S., "Photosensitive Diazo Cpds", Focal Press, 1964, pp. 21-25.

*Primary Examiner*—Charles L. Bowers, Jr.
*Attorney, Agent, or Firm*—Sughrue, Mion, Zinn, Macpeak, and Seas

[57] ABSTRACT

A negative-working image forming process which comprises uniformly exposing a photosensitive material comprising a support having thereon a sensitive layer comprising (i) an o-quinonediazide compound and (ii) a second compound, to actinic radiation which is able to convert the o-quinonediazide compound to the corresponding indenecarboxylic acid compound, and subsequent to said uniformly exposing imagewise exposing said exposed photosensitive material to a laser beam to thereby render the indenecarboxylic acid compound of the imagewise exposed areas convert to the corresponding indene compound and developing with an alkaline developing solution to dissolve out the unexposed area to the laser beam, wherein said second compound reduces the rate of dissolution of the laser exposed areas in the developing solution by converting the indenecarboxylic acid to the corresponding indene compound, whereby said image results.

6 Claims, No Drawings

NEGATIVE IMAGE FORMING PROCESS IN O-QUINONE DIAZIDE LAYER UTILIZING LASER BEAM

CROSS REFERENCE TO RELATED APPLICATION

This application is a continuation of U.S. application Ser. No. 300,822 filed Sept. 10, 1981, now abandoned which in turn is a continuation-in-part of U.S. application Ser. No. 89,846, now abandoned entitled Image Forming Process, now abandoned.

BACKGROUND OF THE INVENTION

1. Field of the Invention

The present invention relates to an image forming process using a laser beam.

2. Description of the Prior Art

As is well known, o-quinonediazide compounds are photosensitive substances used in photosensitive printing plates, photoetching resists or photosensitive copying layers for projected originals, etc. It has been believed that the o-quinonediazide compounds form carboxyl group containing compounds by decomposition of the diazo group by application of actinic radiation. Therefore, when a copying layer containing the o-quinonediazide compound is developed with an alkaline developer after exposure to light, the exposed portion is removed from the base to form an image composed of the unexposed portion, i.e., so-called positive-positive type image formation.

In processes carried out hitherto, a photographic printing technique has been used which comprises contact or projection exposure to form a print. In producing an original for photographic plate making using the production of printing plates as an example, it is necessary to carry out a complicated processing. Namely, processing comprises photographing an original print obtained from a typographic composition on a lithographic film by means of a plate making camera, developing and fixing to form an offset printing plate. A so-called facsimile process comprises scanning the original print to transmit by telephone or telex circuit, scanning a photosensitive plate similarly at the receiving end to expose a facsimile film, developing and fixing, or exposing a film for photo-typesetting by means of a letter generation device of a hand-operated photo-typesetting machine or a computer photo-typesetting machine, developing and fixing; or making an original by exposing printing paper for photo-typesetting developing and fixing, exposing a film using the resultant original by means of a plate making camera or a facsimile device, developing and fixing.

As indicated above, in the prior plate making processes, it is necessary to produce a transparent original for plate making by the above described means prior to the plate making. On the other hand, as a recent development in facsimile transmission or in computers, it has been found highly desirable to use output signals in large quantities at a high speed. Such a process comprising printing on a printing plate using a laser beam modulated by the output signal has been proposed.

As the process for recording images by laser beam information without using an original for phototypesetting, there is a process described in Japanese Patent Application (OPI) 102401/75 (the term "OPI" as used herein refers to a "published unexamined Japanese patent application") which comprises forming a metal layer as a laser recording layer by vacuum evaporation of aluminium or copper, etc. on a photosensitive layer such as a PS plate, etc. or bonding a mask produced by vacuum evaporation of zinc on a polycarbonate film, and selectively removing the metal layer using a laser to produce a transparent original, by which exposure for a plate making step can be carried out at once.

However, the above process has the following fatal defects. Namely, the metal layer is formed directly on the photosensitive layer of a known PS plate by vacuum evaporation as described in Example in said patent application and there is the possibility of degradation of the photosensitive layer by light or heat emitted from an evaporation source upon vacuum deposition, which makes mass production nearly impossible.

The second defect is that to avoid the first, a mask produced by vacuum evaporation of zinc on a polycarbonate film is bonded to the photosensitive layer. However, since the above described mask brings the polycarbonate film into contact with the photosensitive layer of the printing plate, the metal layer functioning as a transparent original does not closely contact with the photosensitive layer of the printing plate. Consequently, resolving power deteriorates, because exposure of the printing plate is carried out through the thickness of the film.

A third defect is that high energy is required for writing on the recording layer by laser, because the recording layer is aluminium, copper or zinc. Accordingly, it is not desirable for practical use.

In order to remove the above described defects, it has been proposed in, for example, Japanese Patent Application 59593/78 that the photosensitive layer of the printing plate is produced so as to have sensitivity to visible radiation such as an argon ion laser beam. Namely, an addition-polymerizable compound having at least one ethylenically unsaturated double bond and a merocyanine dye capable of absorbing the argon laser radiation are combined as a part of a photopolymerization initiator, by which the system has the sensitivity to the laser radiation. According to this process, the layer structure and the plate making step are simplified as compared with the process described in Japanese Patent Application (OPI) 102401/75, as a progressive technique. However, this process suffers fog under yellow light, because the sensitizer (photopolymerization initiator) itself is sensitive to visible light such as emitted by an argon laser. Therefore, this process has a large defect in working properties, because it is necessary to handle it under red light. Further, in the system utilizing the above described photopolymerization reaction, it is necessary for obtaining stabilized image quality (1) to provide an air-intercepting layer on the photosensitive layer or (2) to carry out conditioning in a nitrogen gas prior to exposure, because the photopolymerization reaction is remarkably hindered by oxygen in the air. The treatment in case of (2) is very troublesome and the layer structure in case of (1) is complicated.

As a result of studies of processes for sensitizing many organic photosensitive materials to laser radiation in order to remove the above described defects, it has been found that the above described defects can be removed by incorporating in the photosensitive layer a compound which is not sensitive to common indoor yellow illumination but is sensitive to only high energy radiation such as laser radiation, by which the rate of dissolution of a photodecomposition product of the above described o-quinonediazide compound in the developing solution becomes lower than that in an unexposed portion. Further it has been found that negative images are obtained, namely, one in which the laser unexposed portion is removed by dissolution in the developing solution (negative working).

SUMMARY OF THE INVENTION

An object of the present invention is to provide a recording process using a laser beam, in which the sensitive material is substantially insensitive to common indoor yellow light.

Another object of the present invention is to provide a negative working process for recording images.

The present invention relates to a negative-working image forming process which comprises uniformly exposing a photosensitive material comprising a support having thereon a sensitive layer comprising (i) an o-quinonediazide compound and (ii) a second compound, to actinic radiation which is able to convert the o-quinonediazide compound to the corresponding indene carboxylic acid compound, and subsequent to said uniformly exposing imagewise exposing said exposing photosensitive material to a laser beam to thereby render the indene carboxylic acid compound of the imagewise exposed areas convert to the corresponding indene compound and developing with an alkaline developing solution to dissolve out the unexposed area to the laser beam, wherein said second compound reduces the rate of dissolution of the laser exposed areas in the developing solution by converting the indene carboxylic acid to the corresponding indene compound, whereby said image results.

The term "actinic radiation" is used herein with reference to the o-quinonediazide compound, that is, the term "actinic radiation" refers to radiation to which the o-quinonediazide compound is sensitive to be converted to the corresponding indene carboxylic acid.

DETAILED DESCRIPTION OF THE INVENTION

The function of the second compound (ii) in said phenomenon is not completely understood. However, it has been described in Japanese Patent Application (OPI) 108002/75 that a negative working process is obtained when a sensitive material comprising an o-quinonediazide compound and a secondary or tertiary amine as the second compound is subjected to imagewise exposure, heating at 100° C. for 10 minutes, overall exposure, and development. Considering the above described fact, the functions of the second compound and that of the laser application in the present invention are presumed as follows: namely, high density energy of the laser beam is partially converted into heat energy in the sensitive layer, by which the second compound accelerates a variation in the solubility of photodecomposition product formed from the o-quinonediazide compound in the alkaline developing solution.

As the base used in the present invention, there are planar materials and other materials which do not cause remarkable dimensional changes. Examples of the planar materials include glass, silicon oxide, ceramics, paper, metal plates or films such as aluminium, zinc, magnesium, copper, iron, chromium, nickel, silver, gold, platinum, palladium, alloys containing aluminium as a principal ingredient, alloys containing zinc as a principal ingredient, alloys containing magnesium as a principal ingredient, copper-zinc alloys, iron-nickel-chromium alloys and alloys containing copper as a principal ingredient, metal compounds such as aluminium oxide, tin oxide ($SnO_2$) and indium oxide ($In_2O_3$), and polymers such as regenerated cellulose, cellulose nitrate, cellulose diacetate, cellulose triacetate, cellulose acetate butyrate, cellulose acetate propionate, polystyrene, polyethylene terephthalate, polyethylene isophthalate, polycarbonates of bisphenol A, polyethylene, polypropylene, nylons (6-nylon, 6,6-nylon and 6,10-nylon, etc.), polyvinyl chloride, vinyl chloride-vinyl acetate copolymer, vinyl chloride-acrylonitrile copolymer, vinyl chloride-vinylidene chloride copolymer, polyacrylonitrile, polymethyl acrylate and polymethyl methacrylate. It is possible to use laminates composed of two or more thin layers of the above described materials, such as cermets, iron-aluminium laminated plates, iron-copper-aluminium laminated plates, iron-chromium-copper laminated plates, paper the surface of which was coated with polyethylene, paper the surface of which was coated with cellulose triacetate, aluminium plates having an aluminium oxide layer on the surface thereof formed by anodic oxidation, chromium plates having a chromium oxide layer formed on the surface, glass plates having a tin oxide layer on the surface thereof, and silicon oxide plates having an indium oxide layer on the surface thereof, as the base.

These bases may be transparent or opaque according to the purpose of the photosensitive image forming materials. In case of the transparent bases, it is possible to use not only colorless transparent ones but also colored transparent ones prepared by adding dyes or pigments, as described in *J. SMPTE*, Vol. 67, pages 296 (1958). In case of opaque bases, it is possible to use not only the essentially opaque ones such as paper or metals but also those prepared by adding dyes or pigments such as titanium oxide to transparent materials, plastic films the surfaces of which are processed by a method described in Japanese Patent Publication 19068/72, and completely light-intercepted paper or plastic films prepared by adding carbon black, etc. Further, it is possible to use bases having fine hollows formed by processing such as sanding, electrical etching, anodic oxidation or chemical etching, etc., and bases the surfaces of which are subjected to preliminary processing such as corona discharging, ultraviolet ray application or flame treatment. Moreover, it is possible to use reinforced plastic bases containing reinforcing agenst such as glass fibers, carbon fibers, boron fibers, metal fibers or metal whiskers, etc.

The bases may have, if necessary, a layer which facilitates adhesion, an antihalation layer, an ultraviolet absorption layer or a (visible) light absorption layer on the surface thereof.

The sensitive layer is composed of a photosensitive resin composition comprising an o-quinonediazide compound as a principal component. The photosensitive resin composition contains, in addition to the o-quinonediazide compound, a compound (hereafter "second compound") which is capable of varying the dissolution rate in the developing solution of the laser exposed portion after exposing the entire surface to actinic radiation so as to be lower than the dissolution rate of the laser unexposed portions, and, if necessary, a binder.

The o-quinonediazide compound is a compound having at least one o-quinonediazide group, which increases its solubility in the alkali solution upon application of actinic radiation. Compounds having various structures have been known and described in detail in, for example, *Light-Sensitive Systems* written by J. Kosar, published by John Wiley & Sons, Inc. Particularly, o-benzo- or o-naphthoquinonediazide sulfonic acid esters of various hydroxyl compounds are preferred. Examples include 2,2'-dihydroxydiphenyl-bis(naphthoquinone-1,2-diazide-5-sulfonic acid ester), 2,2',4,4'-tetrahydroxydiphenyl-tetra(naphthoquinone-1,2-diazide-5-sulfonic acid ester) and 2,3,4-trioxybenzophenone-bis(-naphthoquinone-1,2-diazide-5-sulfonic acid ester), etc. Particularly, naphthoquinone-1,2-diazide-5-sulfonic acid esters of polyhydroxyphenols prepared by polycondensation of acetone and pyrogallol as described in Japanese Patent Publication 28403/68 (U.S. Pat. No. 3,635,709) are advantageously used.

As amines of the second compound, it is possible to use secondary amines and tertiary aliphatic or aromatic amines as opposed to aliphatic primary amines such as monostearylamine and aromatic primary amines such as aniline. Examples include dialkylamines, trialkylamines, secondary and tertiary amines containing hydroxyalkyl groups (referred to as hydroxyalkylamine, hereinafter), dialkylamino aromatic hydrocarbons and cyclic polyamines. Examples of the dialkylamines include diamylamine, diheptylamine and didecylamine. Examples of the trialkylamines include tributylamine, triamylamine, trihexylamine and triisoamylamine. Examples of the hydroxyalkylamines include diethanolamine, N-methyl ethanolamine, N-methyl diethanolamine, dipropanolamine and triethanolamine. Examples of the dialkylamine aromatic hydrocarbons include diethylaniline and dipropylaniline. An example of the cyclic polyamines includes hexamethylenetetramine.

5-Member cyclic compounds represented by the following general formula (I) can be used as the second compound used in the present invention:

(I)

where X represents

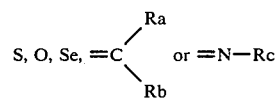

and Ra, Rb, Rc and Y each represent an organic atomic group having no carboxyl group. Y is preferably a substituent having a basic character such as a 2-, 3- or 4-pyridyl group, a morpholino group, a piperidino group, a 1-pyrrolidinyl group, an amino group, an amido group, or an alkyl group substituted with these basic groups. For example, the nitrogen containing a heterocyclic ring may have the formulae I(a)-I(t).

| Principal skeleton | Example |
|---|---|
| 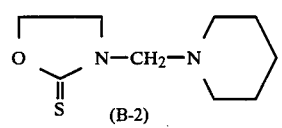<br>I(a) | 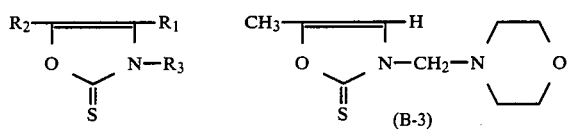<br>(B-1) |
| | (B-2) |
| 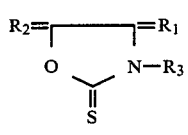<br>I(b) | (B-3) |
| I(c) | 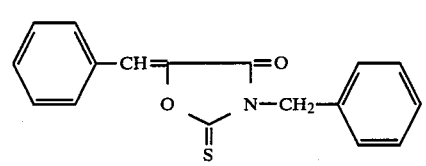<br>(B-4) |

| Principal skeleton | Example |
|---|---|
| 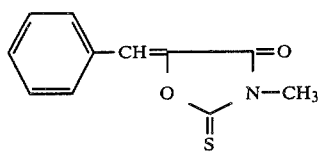 (B-5) | |
| 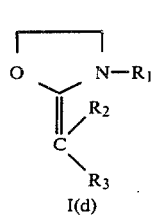 I(d) | 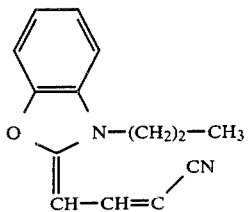 (B-6) |
| 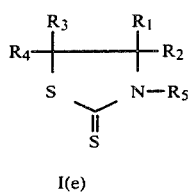 I(e) | 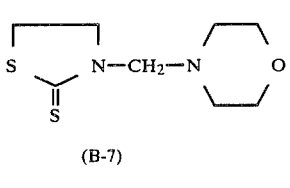 (B-7) |
| 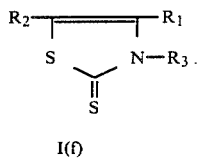 I(f) | 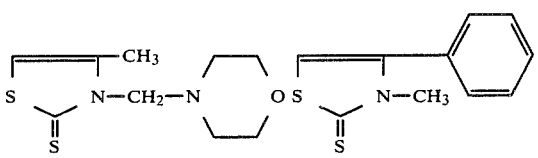 (B-8)  (B-9) |
| | 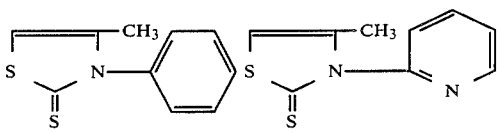 (B-10)  (B-11) |
| | 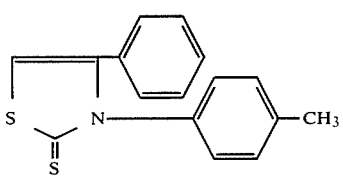 (B-12) |
| | 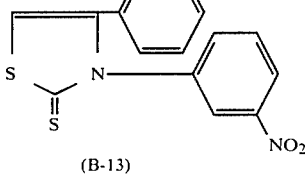 (B-13) |

-continued

| Principal skeleton | Example |
|---|---|
| I(f) (continuation) | (B-14) |
| I(g) | (B-15) |
| | (B-16) |
| | (B-17) |
| I(h) | (B-18) |
| | (B-19) |
| | (B-20) |

-continued
| Principal skeleton | Example |
|---|---|
| 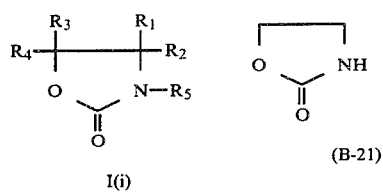 I(i) | 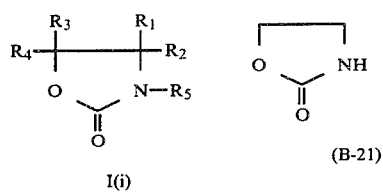 (B-21) |
| 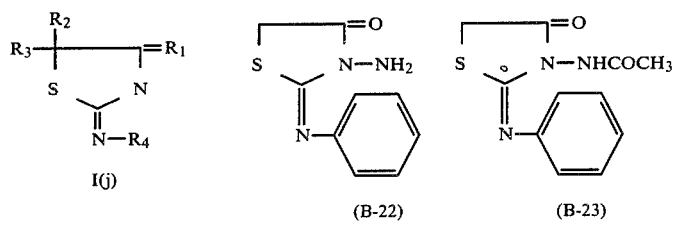 I(j) | 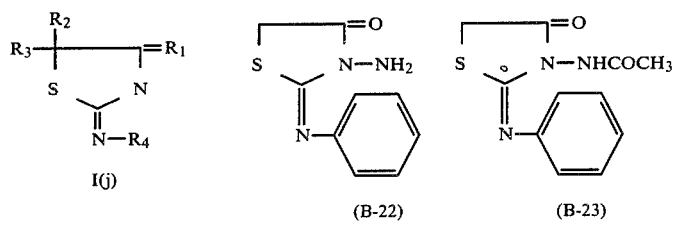 (B-22)　(B-23) |
| 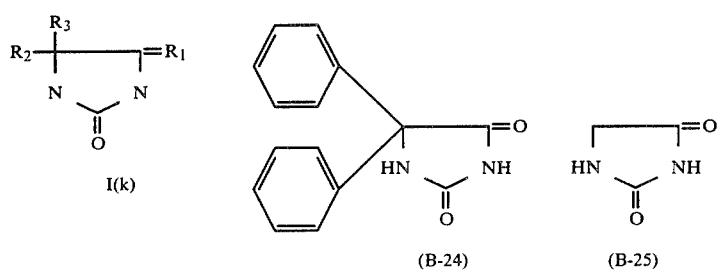 I(k) | 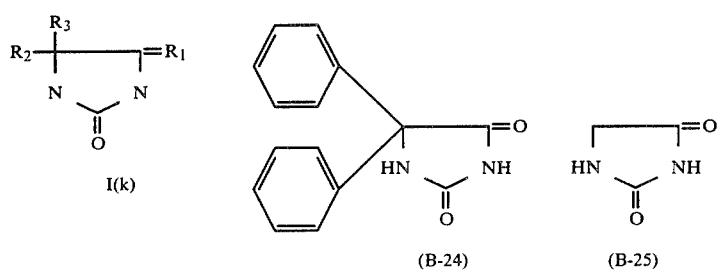 (B-24)　(B-25) |
| 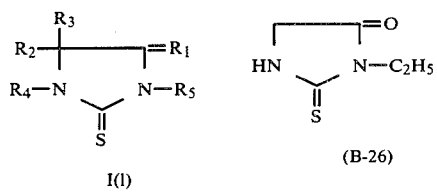 I(l) | 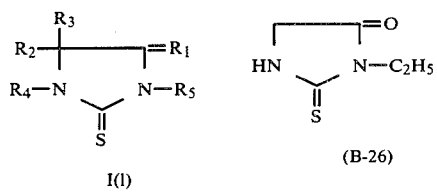 (B-26) |
| 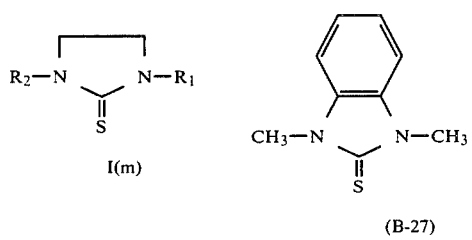 I(m) | 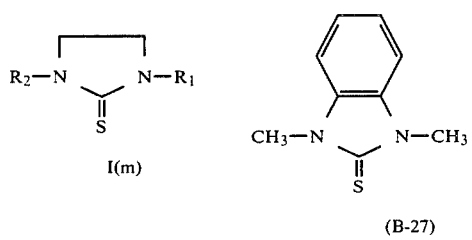 (B-27) |
| | 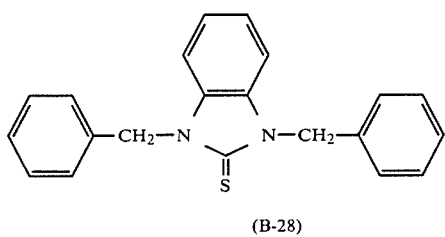 (B-28) |
| 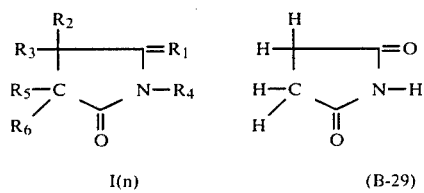 I(n) | 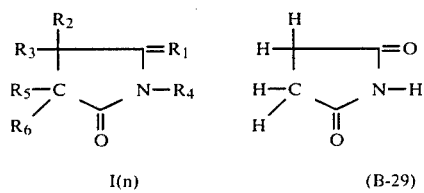 (B-29) |

-continued
| Principal skeleton | Example |
|---|---|
| 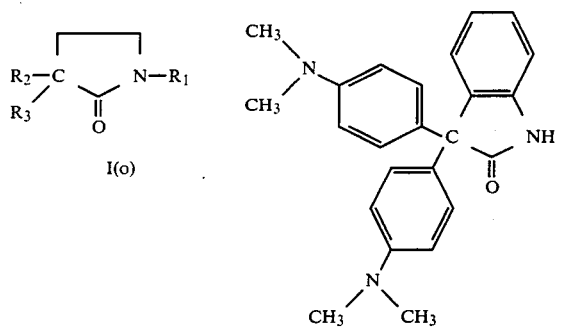 I(o) | (B-30) |
| 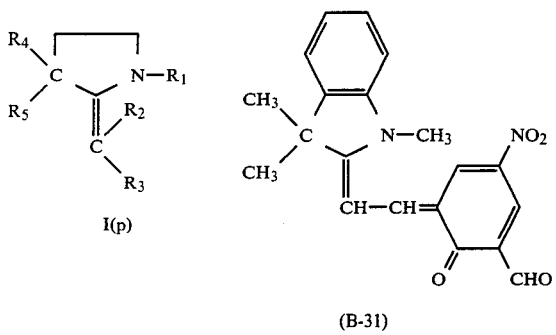 I(p) | (B-31) |
| 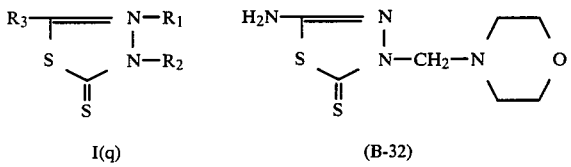 I(q) | (B-32) |
| | 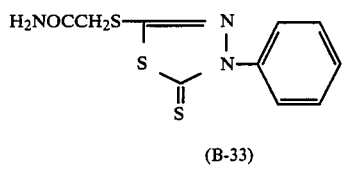 (B-33) |
| 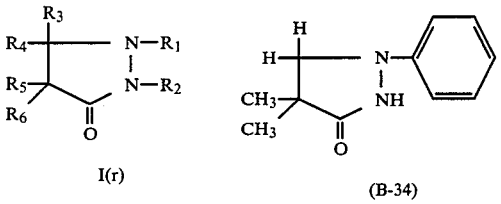 I(r) | (B-34) |
| 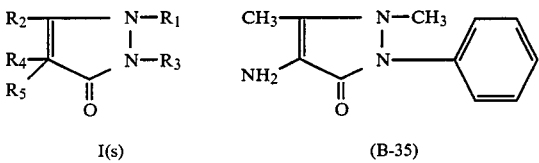 I(s) | (B-35) |

| Principal skeleton | Example |
|---|---|
| 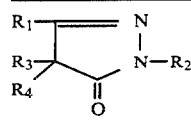 I(t) | 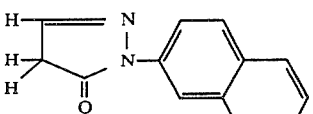 (B-36) |

In the above formulae I(a)-I(t) $R_1$ to $R_8$ in each structural formula represent each an organic atomic group containing no carboxylic acid group such as hydrogen atom, an alkyl group, an aryl group, a hydroxyalkyl group and the basic groups mentioned above for Y.

In another embodiment of the present invention, compounds having a nitrogen containing heterocyclic groups such as pyridine, triazine, quinoline, imidazole, indoline, oxazoline or thiazoline, etc. are also effectively used besides the heterocyclic compounds represented by the above described general formula (I). Among these compounds having nitrogen containing heterocyclic groups, spiropyran compounds represented by the following general formula (II) are particularly preferred.

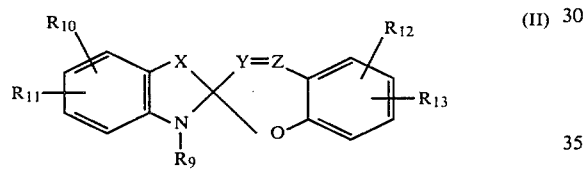 (II)

In the formula, X represents S, O, Se, Te or C(CH$_3$)$_2$, Y and Z represent each C or N, $R_9$ represents a substituted or unsubstituted alkyl group having 1 to 4 carbon atoms, and $R_{10}$, $R_{11}$, $R_{12}$, and $R_{13}$ represent each a hydrogen atom, an alkyl group having 1 to 4 carbon atoms, an alkoxy group, a nitro group, an amino group, a halogen atom, a nitrile group, a formyl group, a hydroxyl group, an alkoxycarbonyl group or an aryloxycarbonyl group, or —CH=CH—CH=CH— by which $R_{10}$ and $R_{11}$ or $R_{12}$ and $R_{13}$ form a cyclic group upon linking each other.

Many of the compounds represented by the above described general formula (II) are known and described in, for example, *Photochromism* pages 45-294, written by Glenn H. Brawn (published by Wiley-Interscience Co., New York, in 1971). Typical compounds are as follows.

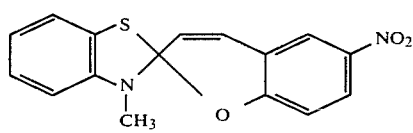

Compound 1

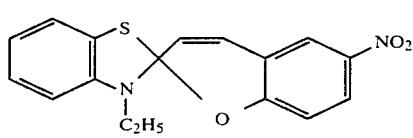

Compound 2

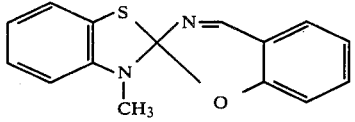

Compound 3

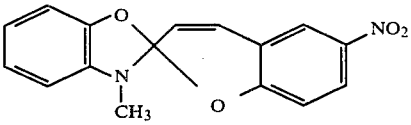

Compound 4

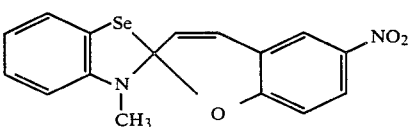

Compound 5

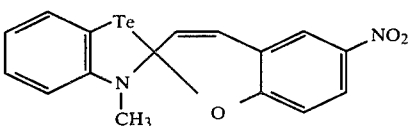

Compound 6

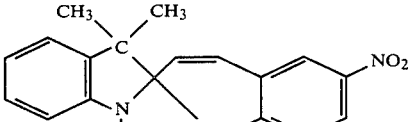

Compound 7

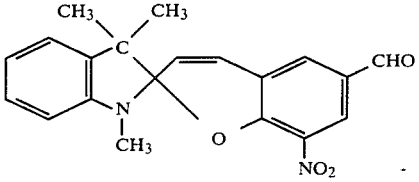

Compound 8

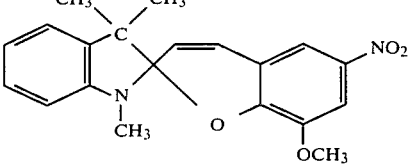

Compound 9

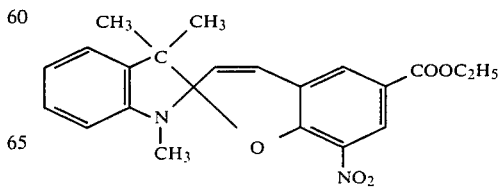

Compound 10

-continued
Compound 11
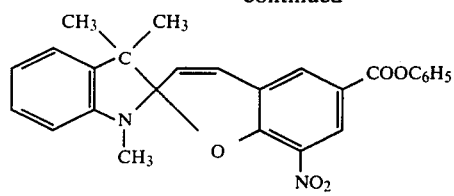
Compound 12
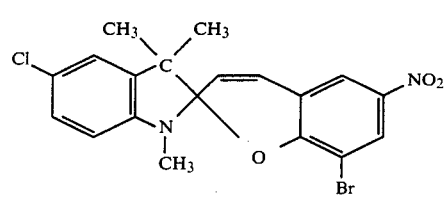
Compound 13
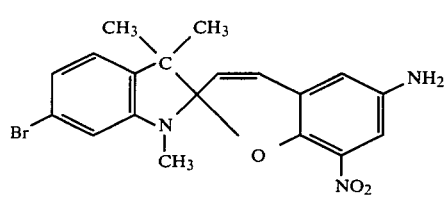
Compound 14
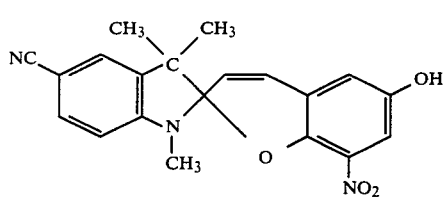
Compound 15
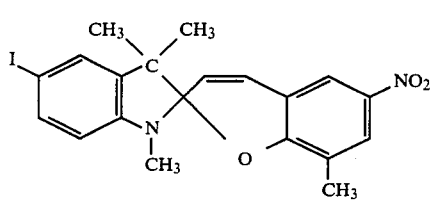
Compound 16
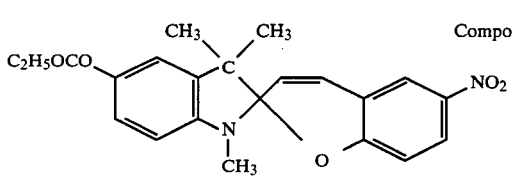
Compound 17
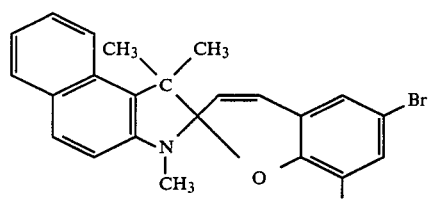
Compound 18
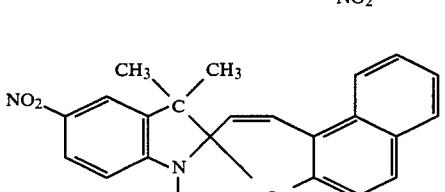
-continued
Compound 19
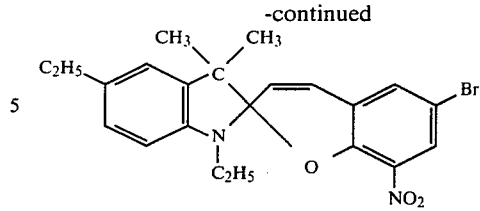
Compound 20
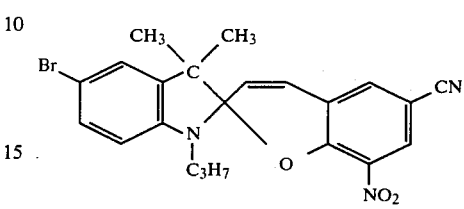
Compound 21
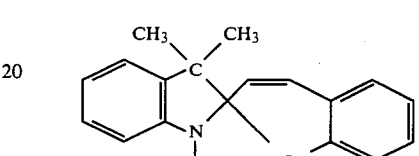
Compound 22
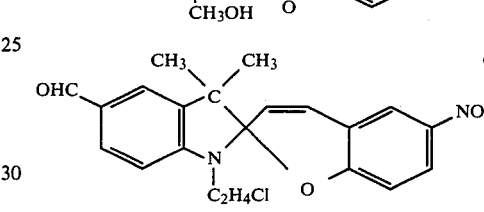
Compound 23
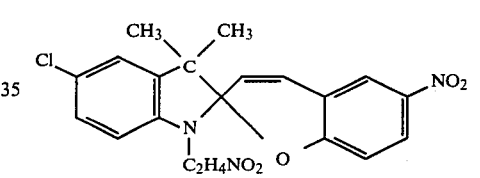
Compound 24
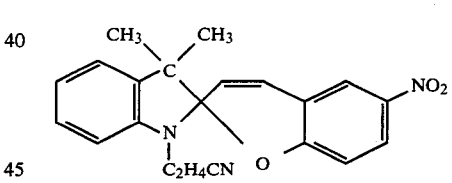
Compound 25
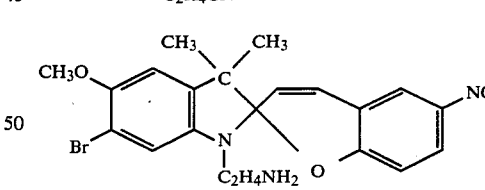
Compound 26
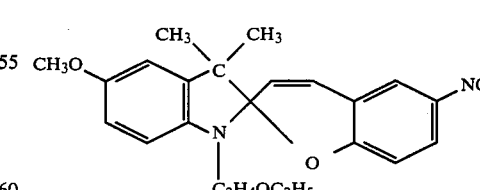
Compound 27
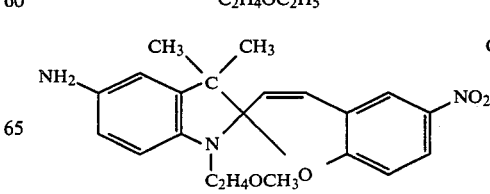

-continued

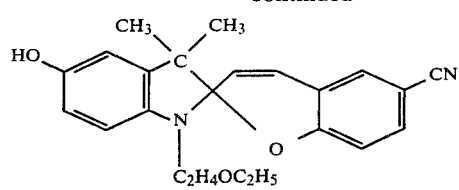
Compound 28

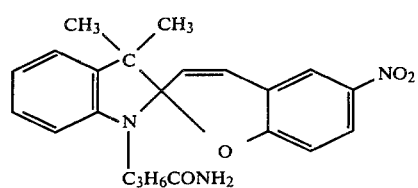
Compound 29

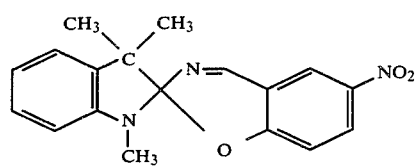
Compound 30

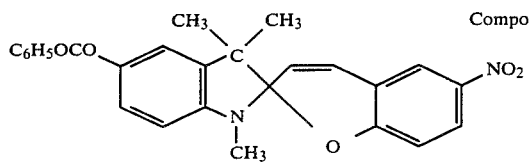
Compound 31

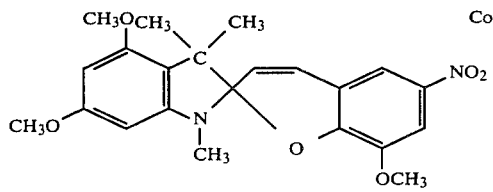
Compound 32

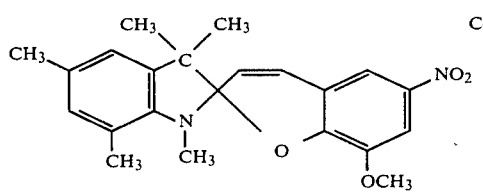
Compound 33

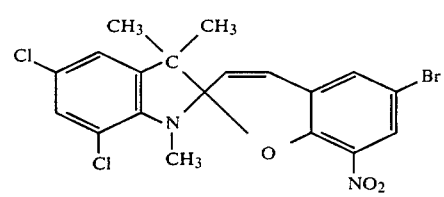
Compound 34

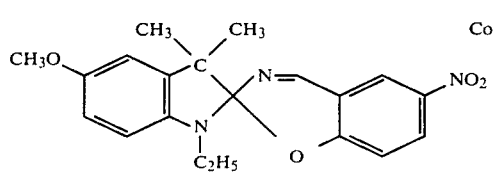
Compound 35

-continued

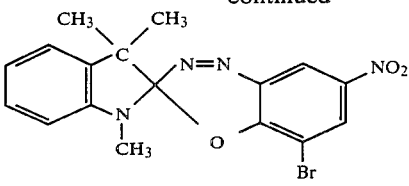
Compound 36

Compound 37

Examples of the hydroxybenzene compounds include pyrogallol, 1,3,5-trihydroxybenzene and 2,2-bis(4-hydroxyphenyl)propane.

1-Hydroxyethyl-2-alkylimidazolines in which the alkyl group contains 7 to 17 carbon atoms and mixtures thereof can also be used as the second compound of the present invention.

Representative carbonyl group containing compounds as the second compound of the present invention are acyloins and acyloin derivatives such as benzoin, toluoin, anisoin or furoin, benzoin methyl ether, benzoin ethyl ether, benzoin isopropyl ether, benzoin sec-butyl ether or toluoin methyl ether, etc.; aryl ketones such as benzophenone, phenyl tolyl ketone, 2-chlorobenzophenone, 2-chloroacetophenone, benzyl, 2,2'-dimethylbenzyl or Michler's ketone, etc.; aromatic ketones in which an oxo group links to a carbon atom on the aromatic ring such as fluorenones, phenyl β-naphthyl ketones, anthrones, benzanthrones or 10,10'-bianthrones, etc., and condensation ketones such as anthraquinone, 1-hydroxyanthraquinone, 1-methylanthraquinone, 2-methylanthraquinone, 2-ethylanthraquinone, 1-chloroanthraquinone, 1-bromoanthraquinone, 2-chloroanthraquinone, phenanthraquinone, 1-methylphenanthraquinone, 4-ethylphenanthraquinone, 4-ethylphenanthraquinone, 2-chlorophenanthraquinone, 3-bromophenanthraquinone, 2,7-di-t-butylphenanthraquinone or benzoanthraquinone, etc.

Many dyes can be effectively used as the second compound as well. Examples include diazo dyes such as Direct Fast Yellow R (C.I.29025) (C.I. represents Colour Index Constitution Number in *Colour Index*, 3rd edition (published by The Society of Dyers and Colourists, Bradford, England and The American Association of Textile Chemists and Colourists, Research Triangle Park, U.S.A., in 1971)), Direct Fast Yellow GC (C.I. 29000), Sumilight Supra Yellow BC conc (C.I. 19555), Chrysamine G (C.I. 22010), Direct Fast Yellow 5GL (C.I. 25300), Benzo Yellow GRL (C.I. 29020), Direct Fast Orange S (C.I. 29150), Neo Zapon Red GE (C.I. 12715), Zapon Fast Red Ge (C.I. 12716), Vali Fast Black #3804 (C.I. 12195) or Alizarin Yellow R (C.I. 14030), etc., anthraquinone dyes such as Oil Red #330 (C.I. 60505), Oil Violet #730 (C.I. 60725), Oil Violet #732 (C.I. 61705), Oleosol Blue G (C.I. 61525), Sumiplast Green G (C.I. 61565), Nihonthrene Yellow GCN (C.I. 67300) or Nihonthrene Violet D/P (C.I. 68700), etc. carbonium dyes such as Acid Violet 5B (C.I. 42640), Patent Pure Blue VX (C.I. 42045), Patent Blue AF (C.I. 42080), Lacto Brilliant Blue FCF (C.I. 42090), Brilliant Acid Blue-R (C.I. 42645), Solar Cyanine 6B conc (C.I. 42660), Orient Soluble Blue OBB (C.I. 42780), Sumitomo Brilliant Blue 5G (C.I. 42120), Acid Brilliant Milling Green B (C.I. 42100), Aizen Auramine 0-125 (C.I. 41000), Para Magenta base (C.I. 42500), Aizen Methyl Violet BB Special (C.I. 42535), Aizen Crystal Violet Power (C.I. 42555), Magenta (C.I. 42510), Aizen Basic Cyanine 6GH (C.I. 42025), Primocyanine BX conc (C.I. 42140), Aizen Victoria Pure Blue BOH (C.I. 42595), Rose Aniline (C.I. 622), Aizen Victoria Blue BH (C.I. 44045), Aizen Diamond Green GH (C.I. 42040), Malachite Green (C.I. 42000), Mitsui Chrome Brilliant Red RX (C.I. 43565), Phenyl Red ($\gamma$-sultone of $\alpha$-hydroxy-$\alpha$,$\alpha$-bis-(4-hydroxyphenyl)-o-toluenesulfonic acid), Aizen Rhodamine BH (C.I. 45170), Rhodamine 6GCP (C.I. 45160), Sunchromine Brilliant Red B (C.I. 45305), Rose Bengale (C.I. 45440), Eosine Y (C.I. 45380), Fluoresceine Y (C.I. 45350) or Acridine Orange (C.I. 46005), etc. quinoneimine dyes such as Sakuranin OK 70 (C.I. 50240), Aizen Gray BLH (C.I. 11825), Aizen Basic Pure Blue 5GH (C.I. 51005), Methylene Blue FZ (C.I. 52015), New Methylene Blue NS conc (C.I. 52030) or Basic Blue GO (C.I. 52025), etc., methine dyes such as Astrazon Pink FG (C.I. 48015), etc. and copper phthalocyanine dyes such as Oil Blue #15 (C.I. 74350), etc. Besides these dyes, it is possible to use dyes having amino groups, alkylamino groups or hydroxyl groups as auxochrome.

In the above described second compound, compounds excepting dyes can be, of course, effectively used alone. However, it is particularly effective to use combinations of a dye having a high laser absorption efficiency and one or more of the second compound other than dyes in order to enhance the sensitivity to laser radiation.

The amount of the second compound used is in a range from about 0.005 to about 10 parts by weight, and preferably from about 0.01 to about 3 parts by weight based on 1 part by weight of the o-quinonediazide compound in the case of the hydroxybenzene compound; or in a range from about 0.005 to about 1 part by weight and preferably from about 0.01 to about 0.3 part by weight based on 1 part by weight of the o-quinonediazide compound in case of the other compounds.

A binder may be included in the composition to give the composition better film strength, etc. A suitable amount of the binder used ranges from 0 to about 20 parts by weight based on 1 part by weight of the o-quinonediazide compound. When the amount of the binder is zero, a compound in which an o-quinonediazide construction is in a side chain of the polymer is used. Suitable examples of such a compound are disclosed in U.S. Pat. No. 3,635,709. Typical examples for binders include a phenol-formaldehyde resin, a cresol-formaldehyde resin, a styrene-maleic anhydride copolymer, a methacrylic acid-methyl methacrylate copolymer, etc.

The photosensitive resin composition used for the process of the present invention may contain various additives in addition to the above descrived components. For example, it is possible to add pigments such as phthalocyanine in order to clarify the image. Further, it is possible to add resins capable of uniformly mixing with the above described components, such as styrene-maleic anhydride copolymer, styrene-acrylic acid copolymer or methacrylic acid-methyl methacrylate copolymer, etc., in order to increase the image strength or as binders. Their use has been well known to persons skilled in this art.

The photosensitive resin composition having the above described composition is applied to the base. The photosensitive resin composition can be applied to the base as a solution of the photosensitive resin composition using a solvent. As the solvent, it is possible to use known solvents which do not damage the photographic properties of the photosensitive resin composition. Application of the photosensitive resin composition or the solution thereof to the base can be carried out by a suitable known method, such as coating which can be easily carried out by persons skilled in the art.

The whole surface of the image recording material produced as described above is uniformly exposed to actinic radiation to which the o-quinonediazide compound is sensitive, thereby the o-quinonediazide compound is converted to the corresponding indene carboxylic acid (generally, light having the wavelength from about 290 nm to about 500 nm although an electronic beam can also be used) in a conventional manner. As a light source of the actinic radiation, it is possible to use a mercury lamp, a xenon lamp, a carbon arc lamp, a tungsten lamp, a fluorescent lamp and sunlight, etc.

The o-quinonediazide is converted to the corresponding indene carboxylic acid by exposing it to the actinic radiation. The sensitive material is then exposed by scanning a laser beam modulated by an image signal.

The time between overall exposure and exposure with a laser can be somewhat prolonged. At ambient temperatures of 10° to 35° C. laser exposed can be postponed as long as 24 hours. At temperatures of 0° to 10° C. and preferably 0° to 5° C. the time between exposures may be a month.

As the laser used for image recording in the present invention, a laser emitting visible radiation is preferred, because laser of invisible infrared rays or ultraviolet rays are a problem in handling. As the laser of visible radiation, there are helium-neon laser, ion laser of argon or cryptone and helium-cadmium laser, etc. Among these lasers, the argon ion laser is particularly preferred because it has good stability and forms a beam having a comparatively high output. In addition, lasers which emit radiation of other than visible range, for example, YAG laser may be used.

As commercially available argon laser, there are those having about 3W, 4W, 6W, 9W, 16W and 24W of the total output of visible rays. In the present invention, lasers having even 3W–4W are suitable. Namely, since it should be estimated that the loss in an optical system is 50% or so, the energy reaching to the recording material reduces by nearly half. But if such a beam is focused by means of a lens system so as to have a 42$\mu$ to 70$\mu$ diameter beam necessary for, for example, a facsimile receiver for newspaper, images can be recorded at a 12 m/sec to 22 m/sec scanning rate which is conventionally utilized.

In order to modulate the argon laser by an image signal, the so-called exterior modulation method which comprises carrying out light modulation outside of a laser devide is advantageously used. In classifying by the function, the modulation is divided into three classes consisting of electric optical light modulation, acoustic optical light modulation and magnetic optical light modulation. Among them, it is believed that the former two are practically utilized generally. However, the acoustic optical light modulation is more excellent because there are many advantages that the contrast is high, it is hardly influenced by a variation of temperature, the modulation element and the driving circuit are small-size and consumption of electric power is low, etc.

The processed image forming material is then subjected to the development processing.

The developing solution used for the development processing can be selected from many known developing solutions used for developing known sensitive layers containing the o-quinonediazide compound. Namely, it can be easily developed by dipping or washing with an alkaline solution. As preferred alkaline solutions, there are aqueous solutions containing inorganic compounds such as caustic soda, caustic potash, sodium silicate, sodium tertiary phosphate, potassium tertiary phosphate, sodium carbonate or potassium carbonate, etc. and aqueous solutions containing organic bases such as ethanolamine, diethanolamine, triethanolamine or tetramethyl ammonium hydroxide, etc. If necessary, organic solvents and surface active agents may be added thereto.

The images obtained by the above described processing are suitable for many uses. For example, in the case of using a sanded aluminium plate as the base, good prints are obtained by applying it to a printing machine after carrying out development. Further, a material prepared by providing a sensitive layer containing dyes on a transparent plastic film such as a polyester film can be used for correction of prints. In addition, it is possible to use photomasks, laser recording of output signals of computers and facsimile recording materials, too.

Moreover, the base of the developed sensitive material may be subjected to various processings according to the purpose. For example, in case of using a glass plate having a chromium vacuum deposition layer as the base, the chromium deposition layer is etched with a known etching solution containing ceric ion after the sensitive layer is developed to form a etching resist, and the resist layer is then removed, by which the base can be used as a hard mask. In case of using a silicon plate as the base, it is possible to make an etching resist of the silicon oxide layer or to use for a lift-off step. In case of using a copper foil plate for making a print circuit plate, it is possible to use as an etching resist or a plating resist after development.

In addition to them, it is possible to use in a step of producing video disks. The use of images obtained by the process of the present invention is not limited to the above described examples.

The present invention is now illustrated with reference to the following non-limiting examples.

EXAMPLE 1

1 part by weight of 1,2-naphthoquinonediazide-5-sulfonic acid ester of polyhydroxyphenyl prepared by polycondensation of acetone and pyrogallol described in Example 1 of Japanese Patent Publication 28403/68, 2 parts by weight of phenol resin (trade name PR-50904, produced by Sumitomo-Durez Co., degree of polymerization: 3-10) and 0.4 part by weight of Oil Blue #15 (C.I. 74350) were dissolved in a mixture of 20 parts by weight of methyl ethyl ketone and 20 parts by weight of methyl cellosolve acetate, and the resulting solution was filtered using a filter having a diameter of 0.5 μm to produce a sensitive solution.

On the other hand, aluminum and iron were deposited on a polyethylene terephthalate film 100 μm thick by vacuum evaporation in an atomic ratio of 98.5 aluminum and 1.5 iron to produce a base plate having a vacuum deposition layer 700 Å thick. To the resulting vacuum deposition base plate, the above described sensitive solution was applied by a rotary coating device in a dry film thickness of 1.0 μm and dried to produce a sensitive plate.

The entire surface of this sensitive plate was uniformly exposed to light at a distance of 55 cm from a 2 KW ultra high pressure mercury lamp for 20 seconds. Then, the surface of the sensitive layer was scanned at 1 cm/second with a helium-neon ion laser beam (diameter of the beam was 20 μm on the surface of the sensitive layer) emitting visible radiation 488 nm and 514.5 nm in wavelength and having 10 mW output.

The sensitive layer was then dipped in a developing solution prepared by dissolving 4 parts by weight of sodium hydroxide, 10 parts by weight of trisodium phosphate (12 hydrate) and 10 parts by weight of potassium hydrobromide in 1,000 parts by weight of water (31° C.). After dipping for 25 seconds, it was taken out, washed with water and dried, by which the sensitive layer and the vacuum deposition layer of the laser exposed portion were remained on the polyester film and the sensitive layer and the vacuum deposition layer of the laser unexposed portion were removed by dissolution in the developing solution, by which an image corresponding to the laser scanning pattern was formed.

EXAMPLE 2

A lithographic 2S aluminium plate grained by a mechanical method (aluminium alloy plate consisting of aluminium: 99%, magnesium: 0.6% and silicon: 0.4%) was dipped in a 2 wt% aqueous solution of sodium hydroxide at 40° C. for 1 minute to corrode the surface. After washing with water, it was dipped in a mixture of sulfuric acid and chromic acid for about 1 minute to expose a pure aluminium surface. It was then dipped in a 20% solution of sulfuric acid kept at 30° C., and anodic oxidation was carried out under conditions of 15 V direct current voltage and 3 A/dm² current density for 2 minutes. Then, it was dipped in an aqueous solution of sodium molybdate having 2.0% by weight concentration at 65° C. for 90 seconds, and dried.

On the other hand, a sensitive solution having the following composition was prepared and applied to the above described aluminium plate using a rotary coating apparatus so as to provide a 2.5 μm thick dry film to produce a sensitive plate.

| Composition of sensitive solution | |
|---|---|
| 1,2-Naphthoquinonediazide compound (the same compound as in Example 1) | 10 parts by weight |
| Phenol resin (same as Example 1) | 20 " |
| Rose Aniline (C.I. 622) | 1 " |
| Methyl ethyl ketone | 120 " |
| Methyl cellosolve acetate | 120 " |

The whole surface of the above described sensitive plate was uniformly exposed in the same manner as in Example 1 and scanned with an argon ion laser in the same manner as in Example 1 (diameter of the laser beam on the surface of the sensitive layer was 100 μm, and the scanning rate was 4.5 m/sec.). In this case, the scanning was carried out so that the intensity on the surface of the sensitive layer was 800 mW. It was then dipped in a solution prepared by diluting a developing solution of positive type PS plates produced by Fuji Photo Film Co., Ltd. (trade name: DP-1) with water in a ratio by volume of 1:6 (at 27° C.) for 1 minute. In the sensitive plate, the sensitive layer of the laser exposed part remained on the aluminium base and the sensitive layer of the laser unexposed part was removed by dissolution in the developing solution, by which an image corresponding to the laser application was obtained. The resulting sensitive plate was treated with an oil-insensitizing solution having the following composition.

| Composition of oil-insensitizing solution | |
| --- | --- |
| Gum arabic | 100 parts by weight |
| Phosphoric acid (85 wt % aqueous solution) | 40 " |
| Ammonium bichromate | 80 " |
| o-Phenylenediamine | 60 " |
| Water | 1,000 " |

When printing was carried out using the treated sensitive plate as printing plate by means of an offset printing machine, the ink adhered well to the sensitive layer of the sensitive plate, and prints obtained by it was negative on the printed paper corresponding to the laser scanning.

EXAMPLE 3

A sensitive film was produced in the same manner as in Example 1 except that Aizen Victoria Pure Blue BOH (C.I. 42595) was used instead of Oil Blue #15 (C.I. 74350) in the developing solution. When it was subjected to the same processing upon uniform exposure of the entire surface to development as in Example 1, the sensitive layer and the vacuum deposition layer of the laser exposed portion remained on the polyester film and the sensitive layer and the vacuum deposition layer of the laser unexposed portion were removed by dissolution in the developing solution, by which an image corresponding to the laser scanning pattern was formed.

Experimentation

The following experiments were conducted to show the behavior of an o-quinonediazide compound upon exposure to actinic radiation and a laser beam.

Experiment 1

In this experiment it was established that an o-quinonediazide compound (I) decomposes upon exposure to actinic radiation to produce an indenecarboxylic acid (II) and the indenecarboxylic acid (II) decomposes upon exposure to a laser beam to produce an indene compound (III).

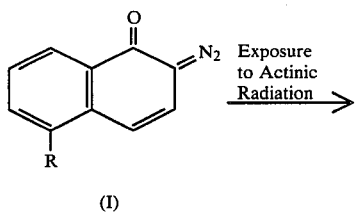

(I)

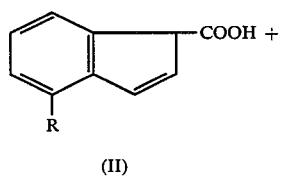

(II)

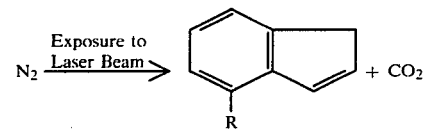

(III)

A photosensitive plate was produced in the same manner as described in Example 1 of the present application and then the entire surface of this plate was uniformly exposed to actinic radiation in the same manner as described in Example 1.

Any changes in the o-quinonediazide compound (I) in the photosensitive layer was observed by infrared spectrophotometry. The results are shown in Table 1.

TABLE 1

| Wave Number (cm$^{-1}$) | Characteristic Group in the Compound | Before Exposure to Actinic Radiation | After Exposure to Actinic Radiation |
| --- | --- | --- | --- |
| 2,100–2,200 | Diazo group in o-quinonediazide | o | x |
| About 1,650 | Carbonyl group in o-quinonediazide | o | x |
| 1,690 | Carboxylic acid group in indenecarboxylic acid | x | o |

Note:
o shows the presence of the group
x shows the absence of the group

The results shown in Table 1 establish that the o-quinonediazide compound (I) was converted to the indenecarboxylic acid (II) by the exposure to actinic light.

Next, the exposed surface of the photographic plate was imagewise exposed to a laser beam in the same manner as in the Example 1. Proceeding in the same manner as described above, it was confirmed that the absorption at 1,690 Kayser disappeared. Thus, this result established that $CO_2$ was released from the indenecarboxylic acid and indene compound (III) was produced.

The same experiment as described above was repeated except that the photosensitive plate was not exposed to actinic radiation.

By infrared spectrophotometry as above, it was determined that there was no change in the infrared absorption of the photosensitive layer upon laser beam irradiation, i.e., it was established that the o-quinonediazide compound (I) was not affected by a laser beam having an energy level sufficient to convert indenecarboxylic acid (II) to indene compound (III), even though laser exposure is conducted in the presence of the second compound.

Experiment 2

This experiment establishes that the behavior of an indenecarboxylic acid (II) in the presence of a second compound per the present invention is specific.

The same experiment as described in Experiment 1 was repeated except that the Oil Blue #15 (C.I. 74350) was not included in the photographic material.

Using infrared spectrophotometry as in Experiment 1, it was observed that there was no change in the infrared absorption at 1,690 Kayser. This establishes that when the second compound is not included in the photosensitive material the indenecarboxylic acid (II) does not convert to the indene compound (III). Further, it could be seen with the naked eye that the areas exposed with the laser beam were also dissolved by treating with an alkaline developer solution.

Thus, it can be said that the second compound of the present invention acts as a catalyst for the decomposition of the indenecarboxylic acid (II) upon exposure with a laser beam. Further, it can be said that the phenol resin used as a binder is not affected by the laser beam radiation which has an energy level sufficient to convert the indenecarboxylic acid to the indene compound under the presence of the second compound.

Experiment 3

This experiment was conducted to show that substantially the same results can be obtained as in Experiment 1 without using a binder (phenol resin which is a novolak resin). In this Experiment, substantially the same procedure as in Experiment 1 was followed except that the phenol resin was not used.

3 parts by weight of 1,2-naphthoquinonediazide-5-sulfonic acid ester of polyhydroxyphenyl were prepared by polycondensation of acetone and pyrogallol to yield a product having the following formula:

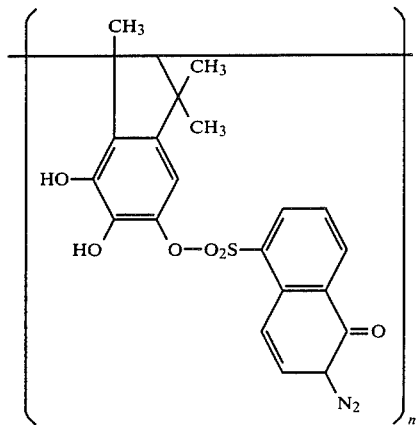

The above is a representative formula for the ester. The product and 0.4 part by weight of Oil Blue #15 (C.I. 74350) were dissolved in a mixture of 20 parts by weight of methyl ethyl ketone and 20 parts by weight of methyl cellosolve acetate, and the resulting solution was filtered using a filter having a diameter of 0.5 μm to produce a sensitive coating solution.

The thus obtained coating solution was coated on a support prepared in the same manner as in Example 1 of the present application to obtain a photosensitive material.

(i) The entire surface of the thus obtained photosensitive material was uniformly exposed to a 2 KW ultra high pressure mercury lamp at a distance of 55 cm from the lamp for 20 seconds.

Any changes in the o-quinonediazide compound in the photosensitive layer were observed by infrared spectrophotometry and the solubility of the resulting material in the alkaline developer used in Example 1 was determined.

The entire surface of the photosensitive material exposed to the actinic radiation as described above was then exposed to a laser beam by scanning at 1 cm/sec using a helium-neon laser beam having 10 mw output by focusing to a 20 μm beam diameter. Infrared spectrophotometry and determination of the solubility of the thus exposed photographic material were carried out in the same manner as described above.

The results obtained are shown in Table 2.

(ii) The same procedure as described in (i) above was carried out except that the photosensitive material was firstly exposed to the laser beam and then to the actinic radiation.

The results obtained are shown in Table 3.

TABLE 2

| Wave Number (cm$^{-1}$) | Before Exposure to Actinic Radiation | After Exposure to Actinic Radiation | After Exposure to Laser Beam |
|---|---|---|---|
| 2,100–2,200 (diazo group in o-quinonediazide) | o | x | x |
| About 1,650 (carbonyl group in o-quinonediazide) | o | x | x |
| 1,690 (carboxylic acid group in indenecarboxylic acid) | x | o | x |
| Solubility in Alkaline Developer | x | o | x |

Note:
o shows the presence of the group or shows solubility in the developer.
x shows the absence of the group or shows insolubility in the developer.
The same symbols have the same meaning in Table 3.

TABLE 3

| Wave Number (cm$^{-1}$) | Before Exposure to Actinic Radiation | After Exposure to Actinic Radiation | After Exposure to Laser Beam |
|---|---|---|---|
| 2,100–2,200 (diazo group in o-quinonediazide) | o | o | x |
| About 1,650 (carbonyl group in o-quinonediazide) | o | o | x |
| 1,690 (carboxylic acid group in indenecarboxylic acid) | x | x | o |
| Solubility in Alkaline Developer | x | x | o |

In experiments (i) and (ii) the o-quinonediazide compound changes in the following manner.

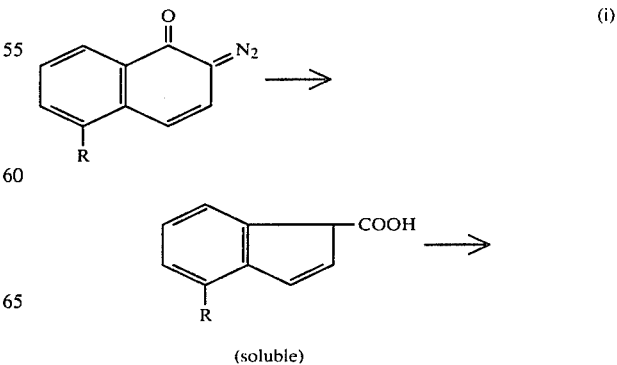

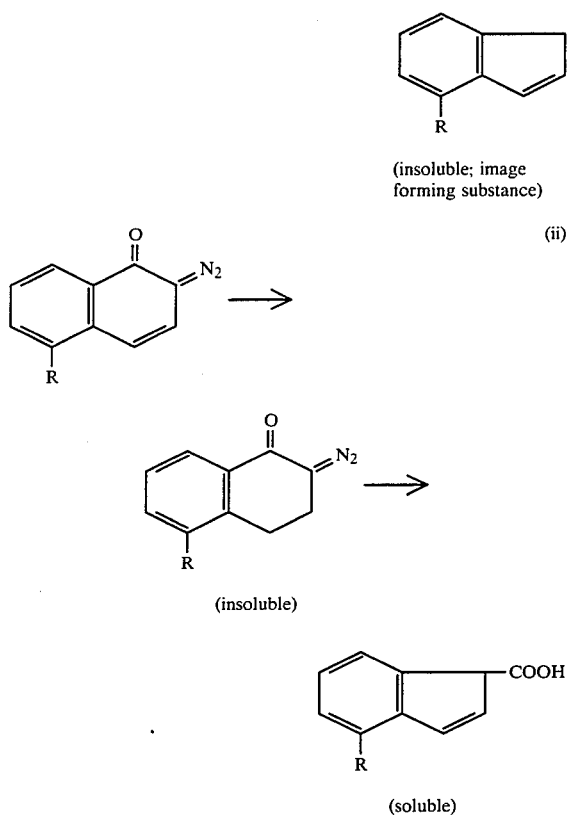

(insoluble; image forming substance)

(insoluble)

(soluble)

As can be seen above, it is clear that the order of exposure to laser beam and to actinic radiation is critical in the present invention.

Experiment 4

A photographic plate A was produced in the same manner as in Example 1 except that Rose Aniline (C.I. 622) was used instead of Oil Blue #15 (C.I. 74350), and a photographic plate B was produced in the same manner as for the photographic plate A except that any second compound was not used.

The entire surface of photographic plates A and B were uniformly exposed to light at a distance of 55 cm from a 2 KW ultra high pressure mercury lamp for 20 seconds. Then, the surface of the photographic plates A and B were scanned at a rate as shown in Table 4 with an argon ion laser beam (diameter of the beam was 25 μm on the surface of the sensitive layer) emitting visible radiation 488 nm and 514.5 nm in wavelength which was controlled so as to be 500 mW on the surface of the sensitive layer to obtain plates A' and B', respectively.

The same experiment as described above was repeated except that photographic plates A and B were firstly scanned with the laser beam, and then exposed to light of the ultra high pressure mercury lamp to obtain plates A" and B", respectively.

The thus obtained plates were developed in the same manner as described in Example 1 and it was observed whether images were obtained or not on these plates. Results obtained are shown in Table 4 wherein o shows that an image was obtained and x shows that no image was obtained.

TABLE 4

| Scanning Speed | Photographic Plate Containing Second Compound | | Photographic Plate Containing No Second Compound | |
|---|---|---|---|---|
| | A' | A" | B' | B" |
| 19 m/sec | o | x | x | x |
| 9 m/sec | o | x | x | x |
| 30 cm/sec | o | o | o | o |
| 1 cm/sec | o | o | o | o |

As can be seen above, when a photographic material contains the second compound and treatments of the present invention are applied thereto an image can be obtained even if the scanning speed of the laser beam is very large, that is, the applied exposure of the laser beam is very small. On the contrary, when the photographic material is not exposed to an actinic radiation prior to subjecting to a laser beam exposure and/or when the photographic material contains no second compound, an image cannot be obtained by applying such low laser beam exposure. In such a case, only when the scanning speed is very small, that is, only when a high laser beam exposure is applied to the photographic material, an image can be obtained.

These phenomena shown in Experiments 1 to 4 were established using various o-quinonediazide compounds and various second compounds shown hereinbefore.

While the invention has been described in detail and with reference to specific embodiments thereof, it will be apparent to one skilled in the art that various changes and modifications can be made therein without departing from the spirit and scope thereof.

What is claimed is:

1. A negative-working image forming process which comprises uniformly exposing a photosensitive material comprising a support having thereon a sensitive layer comprising an admixture of (i) an O-quinonediazide compound and (ii) a second compound selected from the group consisting of diazo dyes, anthraquinone dyes, quinoneimine dyes, methine dyes, copper phthalocyanine dyes and dyes having amino groups, alkylamino groups or hydroxyl groups as an auxochrome, to actinic radiation which is able to convert the o-quinonediazide compound to the corresponding indenecarboxylic acid compound, and subsequent to said uniformly exposing imagewise exposing said exposed photosensitive material to a laser beam to thereby render the indenecarboxylic acid compound of the imagewise exposed areas converted to the corresponding indene compound and developing with an alkaline developing solution to dissolve out the unexposed area to the laser beam, wherein said second compound reduces the rate of dissolution of the laser exposed areas in the developing solution by converting the indenecarboxylic acid to the corresponding indene compound, whereby said image results.

2. The process of claim 1, wherein said second compound is a combination of said dye and at least one member selected from the group consisting of secondary or tertiary, aliphatic or aromatic amines, compounds of formula (I) below, compounds of formula (II) below, and hydroxy benzene compounds and carbonyl group-containing compounds

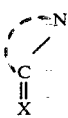
(I)

wherein X represents

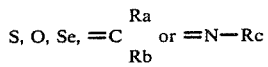

and Ra, Rb, Rc and Y each represents an organic atom group having no carboxyl group and

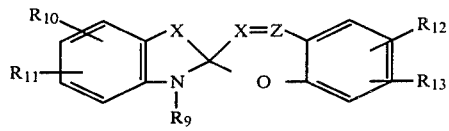
(II)

wherein X represents S, O, Se, Te or C(CH₃)₂, Y and Z represent each C or N, R₉ represents a substituted or unsubstituted alkyl group having 1 to 4 carbon atoms, and $R_{10}$, $R_{11}$, $R_{12}$ and $R_{13}$ represent each a hydrogen atom, an alkyl group having 1 to 4 carbon atoms, an alkoxy group, a nitro group, an amino group, a halogen atom, a nitril group, a formyl group, a hydroxyl group, an alkoxycarbonyl group or an aryloxycarbonyl group, or —CH=CH—CH=CH— by which $R_{10}$ and $R_{11}$ or $R_{12}$ and $R_{13}$ form a cyclic group upon linking each other.

3. The process of claim 1, wherein said dye is present in an amount of about 0.005 to about 1 part by weight based on 1 part by weight of o-quinonediazide compound.

4. The process of claim 1, wherein said actinic radiation is light having a wavelength of about 290 to 500 nm.

5. The process of claim 1, wherein said laser is an argon ion laser.

6. The process of claim 1, wherein said o-quinonediazide compound is selected from the group consisting of 2,2'-dihydroxy-diphenyl-bis(naphthoqhinone-1,2-diazide-5-sulfonic acid ester), 1,1',4,4'-tetrahydroxydiphenyl-tetra(naphthoquinone-1,2-diazide-5-sulfonic acid ester), 2,3,4-trioxybenzophenone-bis(naphthoquinone-1,2-diazide-5-sulfonic acid ester), and naphthoquinone-1,2-diazide-5-sulfonic acid esters of polyhydroxyphenols prepared by polycondensation of acetone and pyrogallol.

* * * * *